(12) United States Patent
Singh et al.

(10) Patent No.: US 7,262,116 B2
(45) Date of Patent: Aug. 28, 2007

(54) LOW TEMPERATURE EPITAXIAL GROWTH OF SILICON-CONTAINING FILMS USING CLOSE PROXIMITY UV RADIATION

(75) Inventors: Kaushal K. Singh, Santa Clara, CA (US); David Carlson, San Jose, CA (US); Manish Hemkar, Sunnyvale, CA (US); Satheesh Kuppurao, San Jose, CA (US); Randhir Thakur, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/401,578

(22) Filed: Apr. 10, 2006

(65) Prior Publication Data

US 2006/0258124 A1 Nov. 16, 2006

Related U.S. Application Data

(63) Continuation of application No. 10/866,471, filed on Jun. 10, 2004, now abandoned.

(51) Int. Cl.
*H01L 21/20* (2006.01)

(52) U.S. Cl. ............................ 438/478; 117/89; 117/97

(58) Field of Classification Search ........ 438/478–509; 117/84–97; 134/1.2, 1.3
See application file for complete search history.

(56) References Cited

U.S. PATENT DOCUMENTS

| | | | |
|---|---|---|---|
| 4,654,226 A | 3/1987 | Jackson et al. | 427/54.1 |
| 4,843,030 A | 6/1989 | Eden et al. | 437/88 |
| 4,846,102 A | 7/1989 | Ozias | 118/730 |
| 4,874,464 A | 10/1989 | Goodwin et al. | 156/646 |
| 4,885,614 A | 12/1989 | Furukawa et al. | 999/16 |
| 4,910,163 A | 3/1990 | Jain | 437/81 |

(Continued)

FOREIGN PATENT DOCUMENTS

JP      61224353 A      6/1986

(Continued)

OTHER PUBLICATIONS

K. Abe et al., "Growth Mechanism During Silicon Epitaxy by Photochemical Vapor Deposition at Low Temperatures", Jpn. J. Appl. Phys., vol. 38, pp. 3622-3627 (1999).

(Continued)

*Primary Examiner*—Savitri Mulpuri
(74) *Attorney, Agent, or Firm*—Shirley L. Church, Esq.

(57) ABSTRACT

A method of preparing a clean substrate surface for blanket or selective epitaxial deposition of silicon-containing and/or germanium-containing films. In addition, a method of growing the silicon-containing and/or germanium-containing films, where both the substrate cleaning method and the film growth method are carried out at a temperature below 750° C., and typically at a temperature from about 700° C. to about 500° C. The cleaning method and the film growth method employ the use of radiation having a wavelength ranging from about 310 nm to about 120 nm in the processing volume in which the silicon-containing film is grown. Use of this radiation in combination with particular partial pressure ranges for the reactive cleaning or film-forming component species enable the substrate cleaning and epitaxial film growth at temperatures below those previously known in the industry.

27 Claims, 7 Drawing Sheets

U.S. PATENT DOCUMENTS

| | | | |
|---|---|---|---|
| 4,940,505 | A | 7/1990 | Schachameyer et al. ..... 156/612 |
| 5,002,630 | A | 3/1991 | Kermani et al. ............ 156/610 |
| 5,120,394 | A | 6/1992 | Mukai ........................ 156/610 |
| 5,178,682 | A | 1/1993 | Tsukamoto et al. ......... 118/722 |
| 5,179,677 | A | 1/1993 | Anderson et al. ........... 392/411 |
| 5,217,559 | A | 6/1993 | Moslehi et al. ............. 118/722 |
| 5,261,960 | A | 11/1993 | Ozias ........................ 118/719 |
| 5,482,739 | A | 1/1996 | Hey et al. ................ 427/255.2 |
| 5,607,724 | A | 3/1997 | Beinglass et al. ........ 427/255.1 |
| 5,704,985 | A | 1/1998 | Kordina et al. ............. 118/725 |
| 5,855,677 | A | 1/1999 | Carlson et al. ............. 118/666 |
| 6,319,782 | B1 | 11/2001 | Nakabayashi ............... 438/300 |
| 6,399,429 | B1 | 6/2002 | Yamoto et al. ............. 438/166 |
| 6,425,951 | B1 | 7/2002 | Chu et al. ....................... 117/3 |
| 6,455,814 | B1 | 9/2002 | Samoilov et al. ........... 219/390 |
| 6,534,412 | B1 | 3/2003 | Lin ............................ 438/706 |
| 6,589,335 | B2 | 7/2003 | Bulsara et al. ................ 117/89 |
| 6,594,293 | B1 | 7/2003 | Bulsara et al. ................ 372/43 |
| 6,724,019 | B2 | 4/2004 | Oda et al. .................. 257/195 |
| 6,811,448 | B1 | 11/2004 | Paton et al. ................ 439/706 |
| 2002/0056414 | A1 | 5/2002 | Shim et al. ................ 118/719 |
| 2002/0129762 | A1 | 9/2002 | Bulsara et al. ............. 117/102 |
| 2002/0168866 | A1 | 11/2002 | Moriya et al. ............. 438/745 |
| 2002/0168868 | A1 | 11/2002 | Todd .......................... 438/767 |
| 2003/0005881 | A1 | 1/2003 | Shinn .......................... 117/97 |
| 2003/0082300 | A1 | 5/2003 | Todd et al. ............ 427/255.27 |

FOREIGN PATENT DOCUMENTS

| | | |
|---|---|---|
| JP | 03184324 A | 12/1991 |

OTHER PUBLICATIONS

T. Aoyama et al., "Removing Nativx Oxide from Si(001) Surfaces Using Photoexcited Fluorine Gas", Appl. Phys. Lett., vol. 59, No. 20, pp. 2576-2578 (Nov. 1991).

D. Auston et al., "Interfacial and Thin Film Chemistry in Electron Device Fabrication", NTIS Report ADA 214784 (Nov. 1999).

I. W. Boyd et al., "Photo-Induced Large Area Growth of Dielectrics With Excimer Lamps", Mat. Res. Soc. Symp., vol. 617, pp. J4.4.1-J4.4.12 (2000).

De et al., "Effect of Deposition Parameters on the Properties of Amorphous Silicon-Germanium Alloy Films Grown by the Photo-CVD Method", Thin Solid Films (1993) 229(2) pp. 216-222.

Kessler et al., "Direct Photo-CVD Deoption with the Excimer Laser Spectra of a Dielectric Barrier Discharge Lamp", Mat. Res. Soc. Proc. vol. 192 (1990) 559-564.

Konagi et al., "Low Temperature Epitaxy by Photo-Chemical Vapor Deposition". Proceeding Electrochemical Society (1988) pp. 21-28.

N. Miyata et al., "Intermittent Ultraviolet Irradiation for Silicon Selective Epitaxial Growth", Appl. Phys. Lett., vol. 62, No. 6, pp. 588-590 (Feb. 1993).

K. B. Nam et al., "Epitaxial Growth and Time-Resolved Photoluminescence Studies of AlN Epilayers", Proc. Of SPIE, vol. 4992, pp. 202-208 (2003).

J.L. Reglioni et al., "Silicon Epitaxy at Low Temperature, Using UV Cleaning in a Reduced Pressure CVD System", Electronics Letters, vol. 24, No. 7, pp. 408-409 (Mar. 1988).

R.P. Roland, "Low Temperature Photochemical Vapor Deposition of $SiO_2$ Using 172 nm $Xe_2$ Excimer Lamp Radiation with Three Oxidant Chemistries, $O_2$, $H_2O/O_2$, and $H_2O_2$", Chem. Mater. vol. 13, pp. 2493-2500 (2001).

N. Takezoe et al., "Materials Processing Using Vacuum Ultraviolet Rare Gas Excimer Lamps", Mem. Fac. Eng. Miyzaki Univ., No. 28, pp. 1-16 (1999).

Yamada et al., "Heavily p-doped (>10x21 cm) Si and SiGe Films Grown by Photo-CVD at 250° C", J. Electronic Material, vol. 19, No. 10, 1990, pp. 1083-1087.

A. Yamada et al., "Selective Silicon Epitaxy by Photo-Chemical Vapor Deposition at a Very Low Temperature of 160° C", Journal of Electronic Materials. vol. 24, No. 10, pp. 1511-1515 (1995).

T. Yamazaki et al., "Continuous Growth of Low-Temperature Si Epitaxial Layer with Heavy Phosphorous and Boron Doping Using Photoepitaxy", J. Electrochem. Soc., vol. 137, No. 6, pp. 1981-1989 (Jun. 1990).

T. Yamazaki et al., "Heavy Boron Doping in Low-Temperature Si Photoepitaxy", J. Electrochem. Soc., vol. 137, No. 1, pp. 313-318 (Jan. 1990).

J.P. Zhang et al., "Pulsed Atomic Layer Epitaxy of Quarternary AlInGaN Layers for Ultraviolet Light Emitters", Phys. Stat. Sol. A., vol. 188, No. 1, pp. 95-99 (2001).

US 7,262,116 B2

LOW TEMPERATURE EPITAXIAL GROWTH OF SILICON-CONTAINING FILMS USING CLOSE PROXIMITY UV RADIATION

This application is a continuation of U.S. application Ser. No. 10/866,471, filed on Jun. 10, 2004, now abandoned and entitled: "Low Temperature Epitaxial Growth of Silicon-Containing Films Using UV Radiation", which is currently pending.

BACKGROUND OF THE INVENTION

1. Field of the Invention

The present invention pertains to an apparatus and method useful for selective and blanket (non-selective) epitaxial growth of silicon-containing films, where UV radiation is used to enable epitaxial film growth at temperatures of less than about 700° C., while still providing an economically feasible film growth rate.

2. Brief Description of the Background Art

Epitaxial growth of silicon-containing films has become increasingly important due to new applications for advanced logic and DRAM devices. A key requirement for these applications is a lower temperature process, so that device features will not be harmed during fabrication of the device. The lower temperature process is also important for future markets where the feature sizes are in the range of 45 nm to 65 nm, and avoidance of the diffusion of adjacent materials becomes critical. Lower process temperatures are required for both substrate cleaning prior to growth of the silicon-containing epitaxial film and during selective or blanket growth of the epitaxial film. By selective growth, it is generally meant that the silicon-containing film grows on a substrate which includes more than one material on the substrate surface; and, the silicon-containing film selectively grows on a surface a first material of said substrate, with minimal to no growth on a surface of a second material of said substrate.

Selective and blanket, non-selectively, grown silicon-containing epitaxial films, and strained embodiments of such films, including films such as Si, $Si_xGe_{1-x}$, and $Si_xGe_{1-x}$ (C) which are grown at temperatures of less than about 700° C. are required for many current applications. Further, it would be desirable to have the removal of native oxide and hydrocarbons prior to formation of the epitaxial film accomplished at temperatures in the range of about 650° C. or less, although higher temperatures can be tolerated when the cleaning time period is short enough. Not only is the lower temperature processing important to providing a properly functioning device, but it helps prevent the relaxation of metastable strain layers, helps prevent or minimize dopant diffusion, and helps prevent segregation of dopant or Ge/C within the epitaxial film structure. Suppression of facet formation and short channel effects, which is enabled by low temperature processing (low thermal budget processing) is crucial for obtaining high performance devices. FIG. 10 shows a graph 1000 (Arrhenius plot) of the conditions required to produce an oxide-free silicon surface of the kind which is required for good epitaxial growth of silicon-containing films deposited on the surface. The inverse temperature of the substrate is shown on axis 102 in ° $K^{-1}$. The corresponding temperature in ° C. is shown on axis 104 in ° C. The partial pressure of $H_2O$ present in the process chamber is shown on axis 1006 in Torr. It becomes readily apparent that to obtain an oxide-free silicon surface at $10^{-6}$ Torr, for example, it is necessary to raise the substrate temperature to about 800° C. or higher. To be able to obtain an oxide-free silicon surface at about 650° C., would require an $H_2O$ partial pressure of less than $10^{-8}$ Torr, which is not practical in terms of equipment costs.

Current techniques for selective and blanket epitaxial growth of doped and undoped Si, SiGe, and SiGe (C) films are typically carried out using reduced pressure CVD (also referred to as RPCVD or LPCVD). The typical reduced pressure process is carried out at temperatures above 700° C., typically above 750° C.) to get an acceptable film growth rate when the precursor compounds for film deposition are $SiH_4$, $SiH_2Cl_2$ (DCS), $Si_2H_6$, $GeH_4$. For selective deposition processes, these precursor-compounds are combined with additional reagents such as Cl2, HCl, and optionally HBr, by way of example. A carbon-containing silane precursor compound such as $CH_3SiH_3$ may be used as a dopant. In the alternative, inorganic compounds such as $B_2H_6$, $AsH_3$, and $PH_3$, by way of example, may also be used as dopants.

A plot of blanket $Si_xGe_{1-x}$ epi film growth (non-selective growth) from dichlorosilane (DCS) and germane ($GeH_4$) is illustrated in FIG. 1. The growth rate of the $Si_xGe_{1-x}$ epi film in angstroms/minute is shown as a function of the deposition temperature and as a function of the ratio of the DCS:$GeH_4$ in the precursor gas feed to the deposition process. This plot is for deposition of films containing from about 20% to about 28% germanium. To reduce the variation in germanium content in the deposited $Si_xGe_{1-x}$ epi film at different deposition temperatures, it was necessary to adjust the ratio of Si:Ge ratio in the precursor gases used for deposition of the film. FIG. 1 shows a graph 100 of the growth rate in Å/min of the $Si_xGe_{1-x}$ epi film on axis 104 as a function of the DCS:$GeH_4$ precursor gas flow ratio on axis 108, and as a function of temperature in ° C. on axis 102. The data shown in FIG. 1 was generated using a process chamber of the kind described subsequently herein, using a flow rate for the DCS of approximately 100 sccm, and the flow rate for the $GeH_4$ which was varied in the manner indicated. The film formation process illustrated in FIG. 1 was carried out at a process chamber pressure of about 10 Torr. FIG. 1 illustrates the problem of reduced $Si_xGe_{1-x}$ epi film growth rate at temperatures below about 700° C., where the growth rate decreases rapidly from about 400 Å/min at 750° C. to about 15 Å/min at 600° C. This severe decrease in film growth rate at temperatures below about 700° C. is attributed to the fact that the film growth is thermally activated and surface reaction limited.

A similar rapid decrease in film growth rate is observed for the selective deposition of silicon-germanium films. The rapid decrease in film growth rate as temperature decreases is possibly due to a high activation energy required to obtain desorption of $SiCl_2$ from the growing film surface, a low recombinative HCl desorption rate, and low surface mobility.

It is generally known in the art that a silicon-containing substrate may be cleaned to remove organic materials and to remove native oxide from the substrate surface. In some instances such cleaning has incorporated the use of UV cleaning in a reduced pressure CVD system. Such a cleaning may be carried out at a temperature in the range of about 800° C., making use of irradiation of the substrate by deep UV radiation under hydrogen at a pressure ranging from 0.002 to 10 Torr. An apparatus of the kind used to carry out the substrate cleaning process may be a horizontal cold-wall air-cooled quartz chamber where the backside of the wafer being cleaned is heated directly by air-cooled tungsten lamps. Risetime to 900° C. and cooldown time to 200° C. are typically about 5 seconds and about 20 seconds, respectively. The base pressure in the process chamber is typically in the range of about 2 mTorr. After reaching that pressure, hydrogen flow is established. The hydrogen flow is generally for purposes of avoiding contamination of the substrate surface during the cleaning process. The cleaning of the sample is carried out at 800° C., with the sample surface under hydrogen, where the sample surface is submitted for less than one minute to short UV radiation, where the radiation is centered mostly at about 253 nm. Subsequently, an epitaxially-grown silicon (for example) film is deposited from reactive gases such as electronic grade $SiH_4$ and HCl diluted in hydrogen (around $1/1000$). Typically the substrate temperature during deposition of the epitaxially-grown silicon film is about 800° C. and higher. When the processing temperatures for film deposition were above 800° C., initial interface defects are generally avoided.

In some instances, the substrate cleaning is carried out at higher temperatures at atmospheric pressure. There are examples in which, prior to the epitaxial silicon film growth, the wafer substrate is raised to a temperature in the range of 900° C. to 1190° C., where the wafer is subjected to a 60 second hydrogen bake, followed by an etch with HCl doped hydrogen gas for a period of 30 seconds to eliminate semiconductor oxides from the wafer surface. After wafer etching, the chamber is purged with hydrogen, followed by continuing HCl gas flow and the introduction of $SiHCl_3$, where epi growth is subsequently conducted at a temperature in the range of 1,130° C., to provide a silicon film growth rate of about 5 μ/min (50,000 Å/min).

The epitaxial growth of silicon has been carried out using rapid thermal processing techniques to reduce convective heat loss during film growth. The reactant gases used for rapid thermal processing typically include a chlorinated silicon source (e.g., $Si_xH_yCl_z$) mixed with hydrogen, as the reactive carrier. An inert carrier gas may be added, such as argon, neon, xenon, or krypton. The process is carried out at temperatures of the silicon substrate above 750° C. under atmospheric or reduced pressure. When a dichlorosilane gas is used as a precursor, this gas is said to decompose when heated at the boundary layer on the substrate surface to $SiCl_2$ and $H_2$. The $SiCl_2$ is said to diffuse to the surface, to then react with $H_2$ to form HCl and silicon. The HCl is said to be desorbed through the boundary layer into the chamber, where it is carried away. A hydrogen carrier gas is said to be added to improve the deposition rate by supplying sufficient hydrogen concentration to fuel the decomposition of $SiCl_2$ to Si and HCl. A pretreatment of the silicon substrate typically includes a baking step with 10% hydrogen in argon as an ambient environment. The pre-bake temperature is 1,050° C. for 5 seconds, followed by 1,000° C. for 20 seconds. The bake pressure was not specified in the literature. The silicon epi deposition was carried out at 1,000° C., at a process pressure of 50 Torr, and with a reaction mixture of argon/hydrogen gas, 10% hydrogen by volume at 18 slm, with dichlorosilane flow at 90 sccm.

The catalyst-assisted growth of a monocrystalline silicon layer on a silicon substrate during formation of a semiconductor device has also been described in the art. The single crystal silicon layer is formed on a seeding layer made having a lattice match with a single crystal silicon. The seeding layer is formed by CAD (Catalyst assisted deposition) during a CVD (Chemical Vapor Deposition) process. A seeding material such as crystalline sapphire may also be used.

In forming a single-crystal silicon layer by CAD using a catalyst, it is said to be preferable that a gas containing mainly silicon hydride is decomposed through contact with a catalyst body heated to 800-2,000° C., for example 1600-1800° C., to deposit a single-crystal silicon layer on the substrate. Silicon hydride refers to a silane, such as a monosilane, disilane, or trisilane, for example. The catalyst body is at least one kind of material selected from the group consisting of tungsten, tungsten containing thorium oxide, molybdenum, platinum, palladium, silicon, alumina ceramic with metal attached thereto, and silicon carbide. The catalyst material is typically formed as coil, above and facing the substrate. The catalyst body is a resistance wire which is activated and heated to a temperature below its melting point. The incoming silicon hydride gas, and hydrogen, or a doping gas such as $B_2H_6$ or $PH_3$ included as necessary, are introduced to come in contact with the catalyst. By using a catalytic hot filament over the substrate surface and flowing film-forming precursor gases over that hot filament prior to deposition on the substrate, it is said to be possible to deposit an expitaxial silicon seed layer on a substrate which is at a temperature of about 100° C.-700° C., typically 200° C.-600° C. However, there is a problem with metal contamination of the film, with the contamination coming from the catalyst. Without the use of a catalyst, the silicon film formed over such processing temperatures is an amorphous silicon film.

There has recently been some description of the deposition of silicon-containing films over mixed substrates using chemical vapor deposition methods. There is description of the deposition of Si and SiGe films; however, no data is provided for the precise crystalline composition of the films which are produced by this method. The processes employ trisilane ($H_3SiSiH_2SiH_3$) to enable the deposition of "high quality Si-containing films" over the mixed substrates.

In a recent publication, a chemical vapor deposition process is described which is said to make use of chemical precursors which permit deposition of thin films at or near the mass transport limited regime. The embodiments described pertain to the formation of Si-containing and Ge-containing films. The use of higher-order precursors, such as trisilane or trisilane in combination with digermane, is recommended for replacement of silane precursor, for example.

There are also references in the literature which describe pre-treatment of a silicon substrate surface prior to deposition of a silicon epitaxially-grown film on the substrate. In a process referred to as advance integrated chemical vapor deposition (AICVD) for semiconductor manufacture, the substrate is said to be prebaked at a temperature ranging from 800° C. to 900° C. for 10 to 30 minutes with hydrogen flowing in a UHV-LPCVD process chamber, to remove the native oxide from the silicon substrate surface. This is followed by growth of a medium temperature silicon epitaxial layer at a temperature in the range from 600° C. to 900° C. (typically 700° C.-800° C.) to a thickness in the range from 100 Å to 300 Å, using dichlorosilane as the source gas. Subsequent to the silicon epi growth, the dichlorosilane is replaced by silane gas or other hydrogen-containing gas which is fed to the process chamber and the temperature is dropped below 400° C., whereby the surface of the semiconductor substrate is said to be hydrogen terminated.

In another method described for the removal of a native oxide layer, hydrogen gas is used as a processing reagent. Laser projection onto the surface of the substrate is used to enhance the reaction of the hydrogen. No particular wavelength for the irradiation is mentioned. Evidently, the projected laser provides for localized heating at the substrate surface.

A review of the above-mentioned background art and other art known in the field of semiconductor manufacturing indicates that there is a continuing need for a method which enables both blanket and selective deposition of a silicon-containing, epitaxially grown films at a temperature below 750° C., and preferably below about 700° C. In addition, there is a need for a substrate cleaning procedure (in preparation for deposition of the silicon-containing film) which can be carried out at the same or a lower temperature than that of the silicon-containing film deposition, so that devices in the substrate onto which the film is being deposited will not be affected by cleaning of the substrate and deposition of the film.

SUMMARY OF THE INVENTION

We have developed a method of preparing a clean and passivated silicon-containing substrate surface for the deposition of epitaxially-grown, silicon-containing films. The silicon-containing substrate cleaning/passivating method can be used in combination with a method of depositing the silicon-containing films, where at least during film deposition (and optionally during both cleaning and deposition), the substrate surface is exposed to U.V. radiation. Typically a primary cleaning to remove the bulk of organic materials and oxygen is carried out initially using an aqueous HF dip (etch) of the kind generally known in the art. This is followed by a cleaning/passivation method of the present invention which is used to remove minor amounts of residual oxides and to provide the desired surface structure for epitaxial growth of a silicon-containing film over the substrate. The cleaning/passivation method of the invention is typically carried out at a temperature ranging from about 1,000° C. down to about 500° C., depending on whether U.V. radiation is used during the cleaning process. When no U.V. radiation is used, the cleaning and passivation method is typically carried out for as short a time period as possible (typically under 2 minutes), which will provide an adequate surface for epitaxial growth. When U.V. radiation is used, and the wavelength of the radiation ranges from about 310 nm and 120 nm, preferably from about 180 nm to about 120 nm, where the radiation is applied generally over the surface of the substrate from a radiation source located adjacent the substrate surface. Use of the U.V. radiation enables the cleaning and passivation of the substrate surface to be carried out at a lower temperature, typically ranging from about 700° C. to about 500° C. A hydrogen ambient below about 10 Torr is typically applied over the substrate surface during the cleaning and passivation of the substrate.

The deposition of the silicon-containing film is carried out at a temperature below 750° C., typically below 700° C., and preferably below about 650° C., when the typical total pressure in the deposition chamber ranges from about 1 Torr to about 80 Torr, and the U.V. radiation wavelength ranges from about 310 nm down to about 120 nm. Indications are that we can expect to deposit the epitaxially grown silicon-containing films at commercially acceptable growth rates (in excess of about 60 Å per minute), at temperatures in the range of about 650° C., and at lower temperatures with the use of combinations of particular UV radiation sources and film precursor gases. Deposition of blanket and selective silicon epi films from precursors which include structures which can make better use of the UV radiation to enhance the growth rate of the film enables lower temperature film deposition. For example, the use of higher order chlorosilanes, bromosilanes, and silanes, such as dichlorosilane (DCS) or hexachlorodisilane (HCD) precursor generally provides improved growth rate at lower temperatures. The wavelength of U.V. radiation is chosen to match absorption cross-section of specific precursors and to enhance substrate surface activation, so that the absorption cross-section of the precursor and the substrate surface activation are most beneficial at a processing temperature which is acceptable. The reaction product of the chlorosilanes and silanes with a germanium-containing precursor to produce a $Si_xGe_{1-x}$ epitaxial film can be tailored to provide selective deposition on a particular substrate as well.

The silicon-containing substrate surface is typically single crystal silicon or silicon-germanium, but can be extended to other silicon-containing substrates which have the capability to permit epitaxial film growth on the substrate surface.

The cleaning/passivation method and the silicon-containing film growth method do not require the use of a catalyst. Instead, the methods employ the use of U.V. radiation over particular wavelength ranges, in combination with particular partial pressure ranges for the reactive cleaning/passivation and/or film-forming component species, to enable the substrate cleaning/passivation and epitaxial film growth of a silicon-containing film at temperatures below 750° C., typically at temperatures below 650° C.

The radiation wavelength which provides the desired energy to enable a reaction at the substrate surface is within the range of about 310 nm down to about 120 nm. Wavelengths lower than about 180 nm have been demonstrated to be very effective for the film precursor materials described subsequently herein. The radiation may be supplied by excimers of xenon chloride ($\lambda$=308 nm), krypton fluoride ($\lambda$=248 nm), argon fluoride ($\lambda$=193 nm), xenon ($\lambda$=172 nm), argon ($Ar^{++}$) ($\lambda$=257 nm), and krypton ($\lambda$=146 nm); and, by lamps employing xenon ($\lambda$=147 nm), krypton ($\lambda$=117 nm to 124 nm), N2 arc ($\lambda$<150 nm), and D2 ($\lambda$=121 nm). These are examples of radiation sources and are not considered to be the only radiation sources which can be used. Combinations of U.V. radiation sources at different wavelengths may also be used.

We have discovered that during the selective and blanket deposition of silicon-germanium films, radiation at these wavelengths will not only dissociate silicon and germanium hydrides and chlorinated silanes into excited radicals (which are not ions), but will also enhance the surface reaction on the substrate by increasing the adsorption rate of precursor materials and the desorption rate of reaction by-products. For example, in the selective deposition of silicon-germanium films, the $SiCl_2$ desorption rate (for example), recombinative HCl desorption rate, and surface mobility factors all act to create active sites for incoming species.

Since the radiation is directed through a layer of component gases and reactive species toward the surface of the substrate, by controlling the partial pressure of the component gases (from which the cleaning or film-forming species are generated), we are able to drive the reaction so that more species are formed in or react in the vapor phase above the substrate or are formed at or react at the substrate surface. This enables the optimization of species generation and precursor formation in the vapor phase, with concurrent species adsorption and desorption at the substrate surface, so that islands of precipitated or agglomerated materials are not formed on the substrate surface. The application of radiation over the wavelength ranges down to about 170 nm has produced high quality epitaxial silicon-containing films at growth rates ranging from about 100 Å/min to 500 Å/min at temperatures ranging from about 500° C. to about 700° C.

The partial pressure of each component gas, depends on the task to be accomplished, and varies for cleaning/passivation and for deposition of films of different chemical composition. Detailed data is provided in the Detailed Description herein for various embodiments which have been demonstrated experimentally. One skilled in the art, upon reading the teachings and descriptions herein, can, with minor experimentation, adjust the precursor materials from which the film is deposited, the partial pressure of the component gases, the radiation wavelength, and the power density of the radiation to provide an optimized epitaxially-grown, silicon-containing film.

BRIEF DESCRIPTION OF THE DRAWINGS

With reference to FIG. 2A, the −150 mm was at location A (in FIG. 2A), the 0 mm was at location B, and the 150 mm was at location C.

DETAILED DESCRIPTION OF EXEMPLARY EMBODIMENTS

As a preface to the detailed description presented below, it should be noted that, as used in this specification and the appended claims, the singular forms "a", "an", and "the" include plural referents, unless the context clearly dictates otherwise.

We have developed a method of preparing a clean and passivated silicon-containing substrate surface for the deposition of epitaxially-grown, silicon-containing films. The silicon-containing substrate cleaning method can be used in combination with a method of depositing the silicon-containing films, where at least during film deposition (and optionally during both cleaning and deposition), the substrate surface is exposed to U.V. radiation. The silicon-containing substrate cleaning/passivation method is typically carried out at a temperature ranging from about 1,000° C. down to about 750° C. when U.V. radiation is not used. In this instance, the substrate exposure time is minimized to that necessary to permit the desired epitaxial growth on the substrate surface. When U.V. radiation is used during the cleaning process, it is possible to reduce the temperature at which the cleaning and passivation process is carried out. For example, the processing temperature may range between less than 750° C., typically less than 700° C. and about 500° C. The typical total. process pressure in the treatment volume surrounding the substrate surface ranges from about 0.1 Torr to about 80 Torr (typically from about 0.1 Torr to about 30 Torr) of hydrogen. It is possible to have inert gases present in minor quantities as well.

Figure 10:
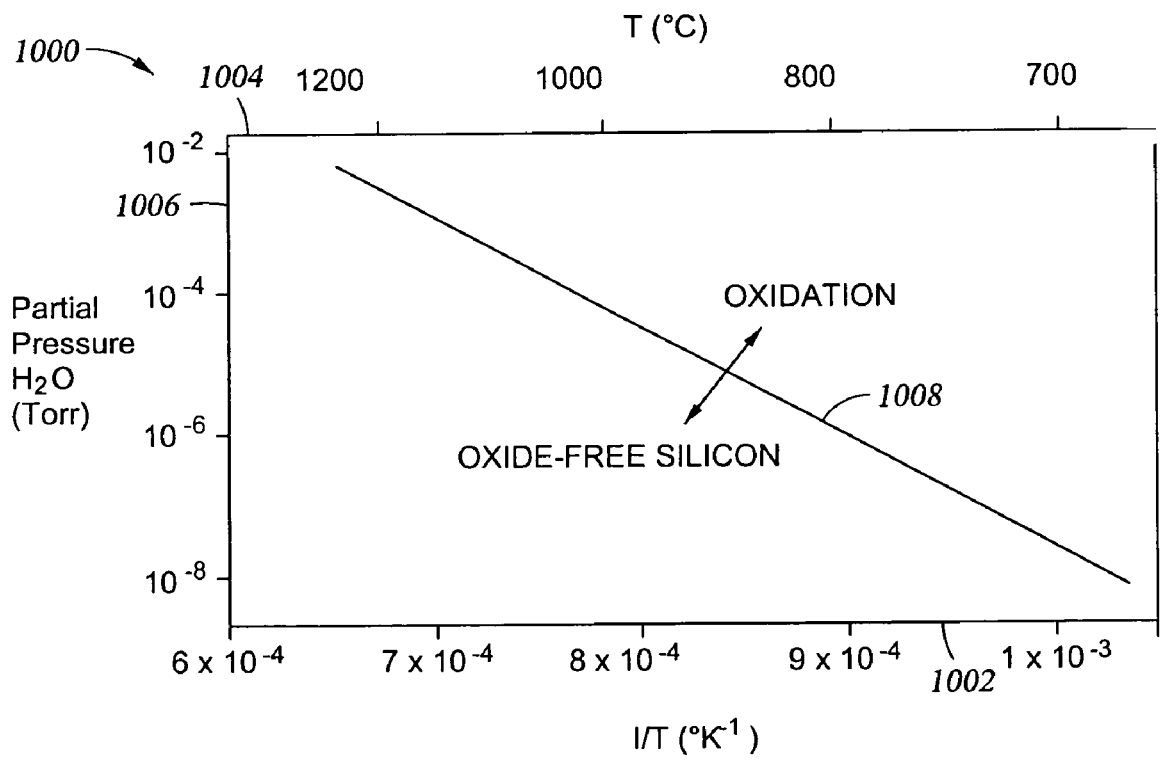
FIG. 10 shows a graph of the effect of the partial pressure of H$_2$O present in the processing chamber at a given temperature on the amount of oxide which is present on a single crystal silicon substrate surface. This graph is related to cleaning of the substrate surface prior to the epitaxial growth of an overlying silicon-containing film.

The general goal during the cleaning and passivating process is the removal of hydrocarbons and oxide from the silicon-containing substrate, as their presence interferes with epitaxial growth of a silicon-containing film over the substrate. FIG. 10 shows the relationship between the partial pressure of $H_2O$ in the processing chamber, the Temperature in the processing chamber (in degrees K) and the presence of oxide on the surface of a silicon substrate. As is apparent from FIG. 10, when the temperature is lower than about 750° C., to have an oxide-free silicon surface requires a partial pressure of $H_2O$ in the process chamber which is in the range of about $10^{-7}$ Torr. This pressure requirement is difficult to meet and leads to apparatus requirements which are very costly.

We have discovered that by treating a silicon substrate in an ambient comprising hydrogen in the presence of U.V. radiation, it is possible to reduce either the temperature at which the processing must be carried out or the time required to clean the surface, or a combination of both. Typically, for purposes of providing a desirable processing window, the total pressure in the processing chamber ranges between about 0.1 and about 80 (as mentioned above) during the silicon-comprising substrate surface cleaning and passivation. The substrate temperature during processing ranges from about 550° C. and about 750° C., and typically ranges between about 550° C. and about 700° C. The power density of the U.V. radiation typically ranges from about 1 mW/cm² to about 25 mW/cm².

The deposition of the silicon-containing film is carried out at a temperature below 750° C., typically below 700° C., and preferably about 650° C. or lower, when the U.V. radiation wavelength ranges from about 310 nm down to about 170 nm. We expect to deposit the epitaxially grown films at temperatures in the range of about 550° C., and possibly at lower temperatures, while providing a commercially acceptable growth rate, upon completion of development of UV radiation sources which provide a wavelength of less than 170 nm, i.e. within the range of about 170 nm to about 120 nm. In addition the use of higher-order silane-based precursors which respond well to U.V. radiation in terms of promoting easy adsorption of reactant species into the substrate surface and easy desorption of reaction by-products from the substrate surface may also be used to enable epitaxial film growth at lower temperatures. The U.V. radiation wavelength can be adjusted to an optimum for a given precursor and substrate activation combination.

The silicon-containing substrate is typically single crystal silicon or single crystal silicon-germanium, but is not intended to be limited to one of these two substrates.

The cleaning/passivation method and the silicon-containing film growth method do not require the use of a catalyst. Instead, the methods employ the use of U.V. radiation over particular wavelength ranges, in combination with particular partial pressure ranges for the reactive cleaning/passivation and/or film-forming component species, to enable the substrate cleaning/passivation and epitaxial film growth of a silicon-containing film at temperatures below 750° C., typically at temperatures below 650° C.

The radiation wavelength which provides the desired energy to enable a reaction at the substrate surface is within the range of about 310 mm down to about 120 nm, typically from about 180 nm down to about 120 nm. We have discovered that during the blanket deposition of silicon-germanium films (and silicon films), employment of UV radiation during film deposition permits a lowering of the substrate temperature during film deposition at a given deposition rate. Further, we have discovered that during selective deposition of silicon-germanium films, radiation at these wavelengths will not only dissociate silicon and germanium hydrides and chlorinated silanes into excited radicals (which are not ions), but will also enhance the surface reaction on the substrate by increasing $SiCl_2$ desorption rate (for example), recombinative HCl desorption rate, and surface mobility to create active sites for incoming species.

Since the radiation is directed through a layer of component gases and reactive species toward the surface of the substrate, by controlling the partial pressure of the component gases (from which the cleaning or film-forming species are generated), we are able to drive the reaction of the species so that more species are formed in the vapor phase above the substrate react at the substrate surface. This enables the optimization of species generation in the vapor phase, with concurrent species adsorption and desorption at the substrate surface, so that agglomerated materials are not formed on the substrate surface. High quality epitaxial silicon-containing films have been obtained at growth rates ranging from about 100 Å/min to 500 Å/min at temperatures ranging from about 600° C. to about 700° C.

I. AN APPARATUS FOR PRACTICING THE INVENTION

The embodiment example etch processes described herein were carried out in an Epi CENTURA® Integrated Processing System available from Applied Materials, Inc., of Santa Clara, Calif. Particular features of this apparatus related to the present invention are described in detail below; however, it is contemplated that other apparatus known in the industry for the epitaxial growth of films may be used to carry out the invention.

Figure 1:
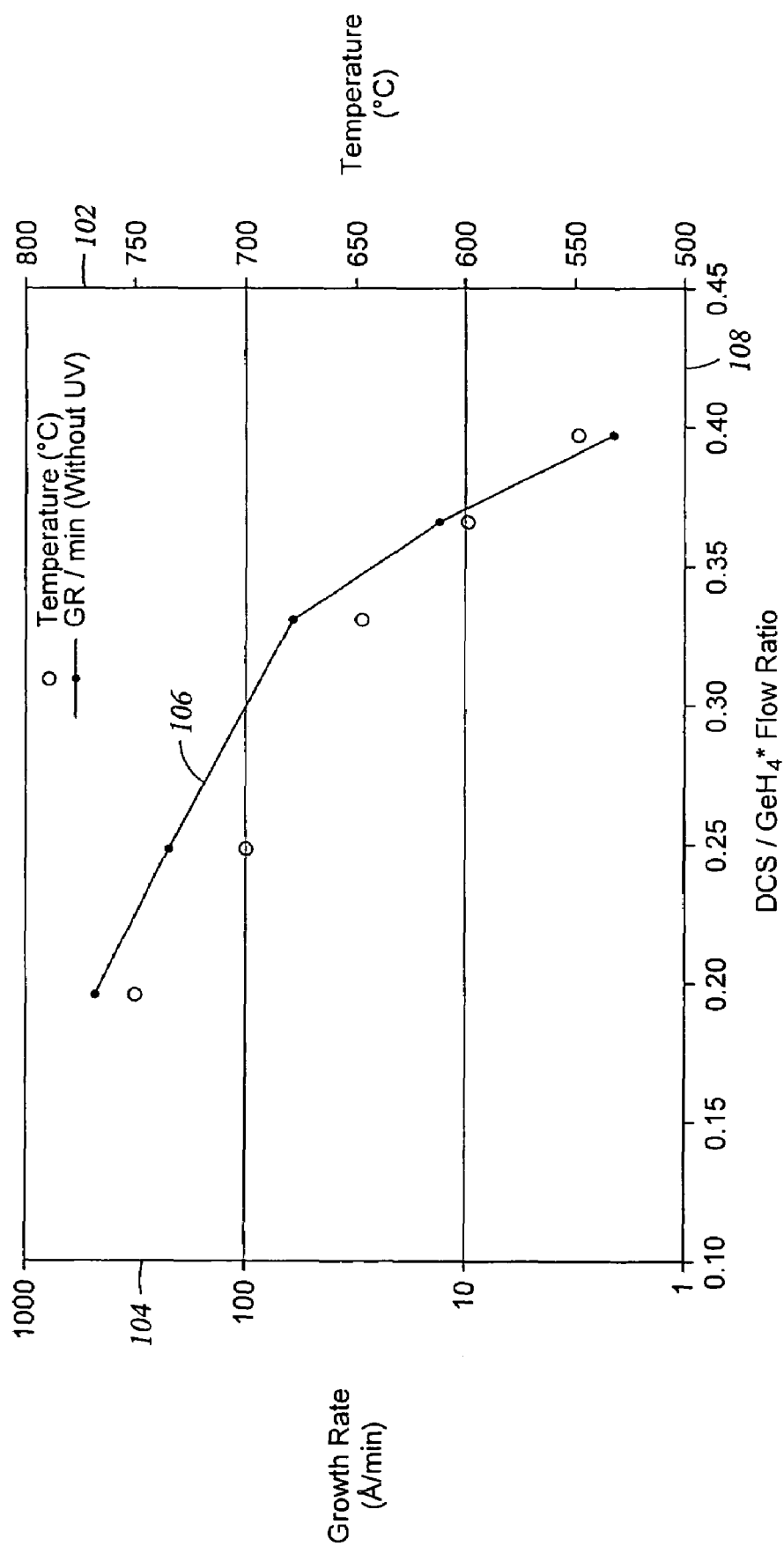
FIG. 1 shows a graph of the epitaxial growth rate of a silicon/germanium film without the benefit of UV radiation during film deposition. The film growth rate is shown in Angstroms/minute as a function of the flow rate ratio of the precursor materials and as a function of the temperature in degrees Centigrade.
Figure 2A:
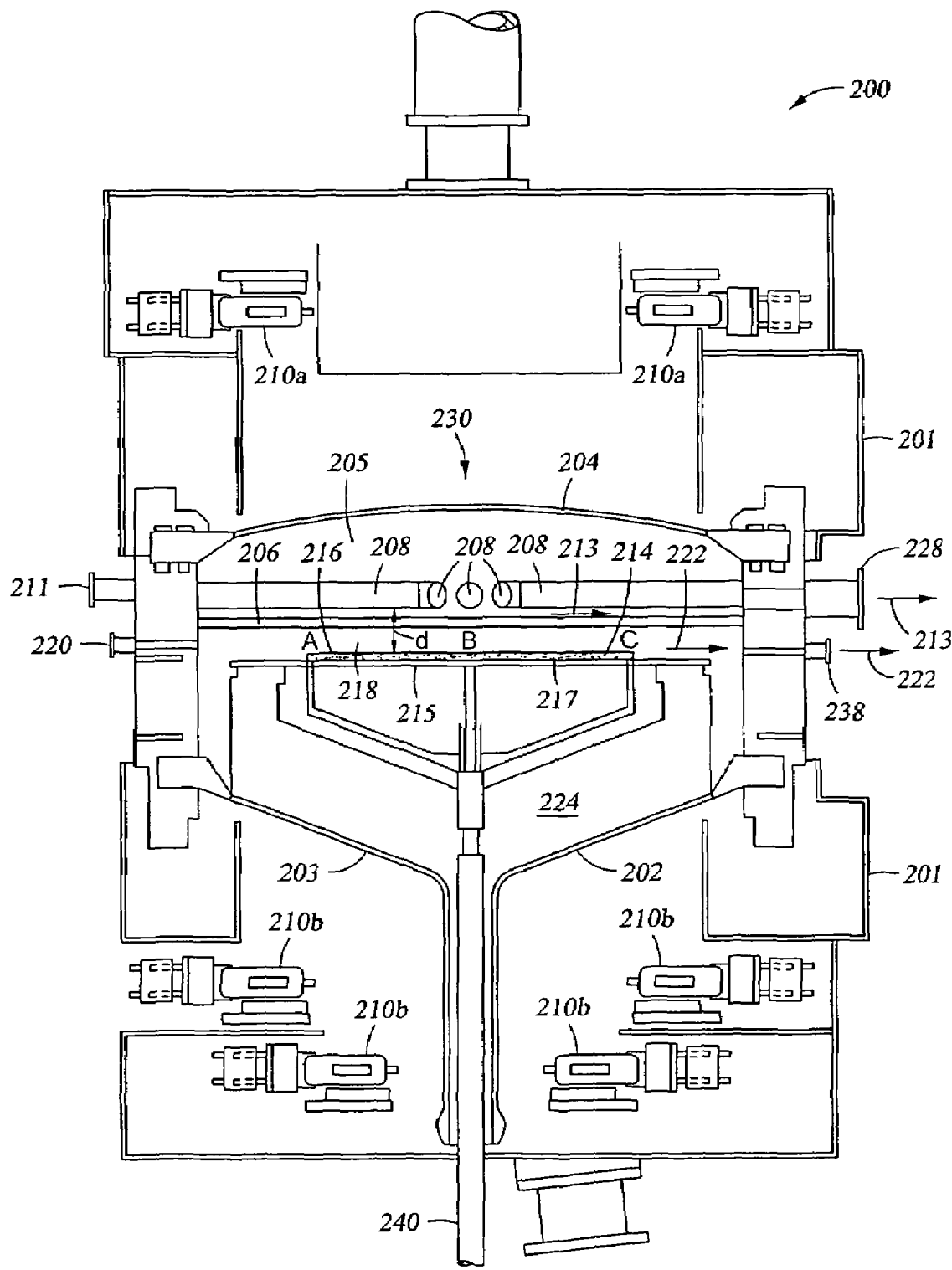
FIG. 2A is a schematic of a cross-sectional view of a process chamber of the kind which can be used to carry out the substrate cleaning method and the silicon-containing film deposition method of the present invention.

FIG. 2A shows a schematic cross-sectional view of a 200 mm Epi deposition chamber 100 which is employed as part of a CENTURA® Integrated Processing System. The CENTURA® Integrated Processing System is a fully automated semiconductor fabrication system, employing a single-wafer, multi-chamber, modular design which accommodates 200-mm or 300-mm wafers. As shown in FIG. 2A, the Epi film deposition process chamber includes 316 L stainless steel housing structure 201 which encloses various functioning elements of the process chamber 200. A detailed description of the apparatus can be obtained from the manufacturer, and only the elements which are important to understanding the present invention are discussed herein. A quartz chamber 230 includes an upper chamber 205 in which the UV radiation source 208 is contained, and a lower chamber 224, in which a processing volume 218 is contained. Reactive species are provided to processing volume 218 and processing byproducts are removed from processing volume 218. A substrate 214 rests on a silicon-coated graphite pedestal 217, and the reactive species are applied to surface 216 of the substrate 214, with byproducts subsequently removed from surface 216. Heating of the substrate 214 and the processing volume 218 is provided for using infrared lamps 210. Radiation from infrared lamps 210 travels through upper quartz window 204 of quartz upper chamber 205 and through the lower quartz portion 203 of lower quartz chamber 224. Cooling gases for upper quartz chamber 205 enter through inlet 211 and exit 213 through an outlet 228.

Precursor reactant materials, as well as diluent, purge and vent gases for lower quartz chamber 224 enter through inlet 220 and exit 222 through outlet 238. The outlets 228 and 238 are in communication with the same vacuum pump or are controlled to be at the same pressure using separate pumps, so that the pressure in upper quartz chamber 205 and lower quartz chamber 224 will be equalized. Note that in FIG. 2A the U.V. radiation source 208 is offset (not shown) from the exit flange 228.

The low wavelength radiation used to energize reactive species and assist in adsorption of reactants and desorption of process byproducts from the surface 216 of substrate 214 typically ranges from about 310 nm to about 120 nm, with combinations of various wavelengths being provided, depending on the composition of the film which is being epitaxially grown. In the embodiment shown in FIG. 2A, this radiation is provided by excimer lamps 208 which are located in the upper quartz chamber 205, and the radiation passes through U.V. transmission window 206 to reach substrate 214. (The UV transmitting window may be formed from other UV transparent materials such as doped synthetic quartz, magnesium fluoride, calcium fluoride, sapphire, and lanthanum fluoride, by way of example.) The spacing of the excimer lamps 208 in the upper quartz chamber 205 is designed to provide even uniformity of radiation over the surface 216 of substrate 214. The spacing "d" between the source of the UV radiation and the upper surface 216 of substrate 214 can be adjusted to accommodate the requirements for the process parameters needed for the particular composition of the film which is being epitaxially grown. For the example embodiments described herein, the spacing between the UV sources and the upper surface 216 of substrate 214 ranged from about 5 cm to about 15 cm, and typically was in the range from about 5 cm to about 10 cm. The power density employed ranged from about 1 mW/cm$^2$ to about 25 mW/cm$^2$, and was typically in the range from 2 mW/cm$^2$ to 10 mW/cm$^2$.

The component gases which are used to clean/passivate a substrate surface or to form the silicon-containing film which is being epitaxially grown enter the processing volume 218 via an entry port shown at 220 and exit through the port shown at 222. Combinations of component gases are typically mixed prior to entry into the processing volume. The overall pressure in the processing volume 218 is determined by a valve (not shown) on the outlet port 238 for flow 222.

The temperature in the upper quartz chamber 205 and on U.V. transmission window 206 is controlled within a temperature range of about 300° C. to 600° C. by the flow of a cooling gas (which enters through port 211 and exits through port 228) in combination with radiation from infrared lamps 210 positioned above upper quartz chamber 204. The temperature in the lower quartz chamber 224 is controlled within a temperature range of about 600° C. to about 300° C., by adjusting the speed of a blower unit which is not shown (but which circulates air or other cooling gas through lower quartz chamber 224, with such gases entering port 220 and exiting port 238) and by radiation from the infrared lamps 210 beneath lower quartz chamber 224.

The temperature on the substrate 214 surface 216 is controlled by setting the power to the lower lamp modules 210$b$ in lower quartz chamber 224 or by setting the power to both the upper lamp modules 210$a$ overlying upper quartz chamber 204 and the lower lamp modules 210$b$ in lower quartz chamber 224.

Figure 2B:
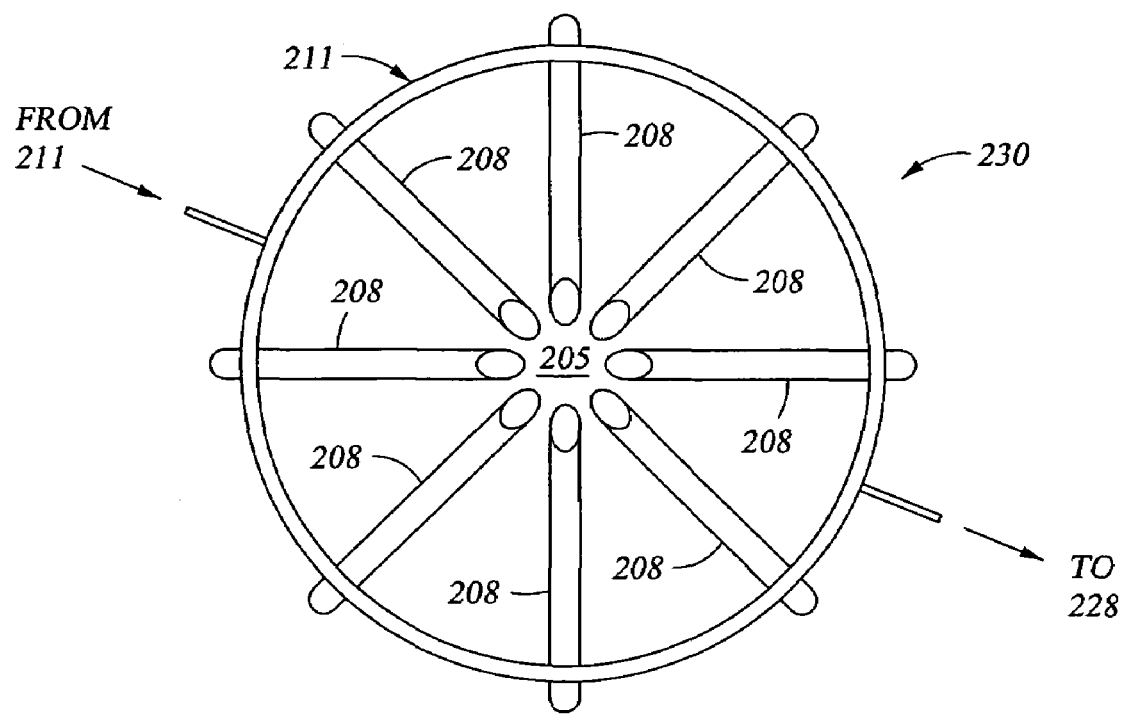
FIG. 2B is a schematic top view of one embodiment showing the positioning of U.V. radiation source lamps within a process chamber of the kind shown in FIG. 2A, with cooling gases entering into the volume which contains the U.V. radiation sources and exiting into venting apparatus (not shown) which is in communication with venting apparatus as shown in FIG. 2A.

FIG. 2B shows a schematic top view of one embodiment showing the positioning of U.V. radiation source lamps within a process chamber of the kind shown in FIG. 2A. Cooling gases enter into the upper quartz chamber volume 205 (which contains the UV radiation sources 208) from an entry port 211 (shown on FIG. 2A). Exiting cooling gases 213 exit to an exit port 228 (shown on FIG. 2A). Exit port 228 is in communication with exit port 238 (shown on FIG. 2A) from which deposition chamber by-products 222 exit, or the pressures at the exit ports are balanced using separate vacuum pumps (not shown) attached to each port so that pressures in the upper quartz chamber volume 204 is equalized with the pressure in lower chamber volume 224 (shown on FIG. 2A), as previously described. Use of separate pumps to control the exiting gases minimizes cross-contamination of the independent volumes 205 and 224.

Figure 2C:
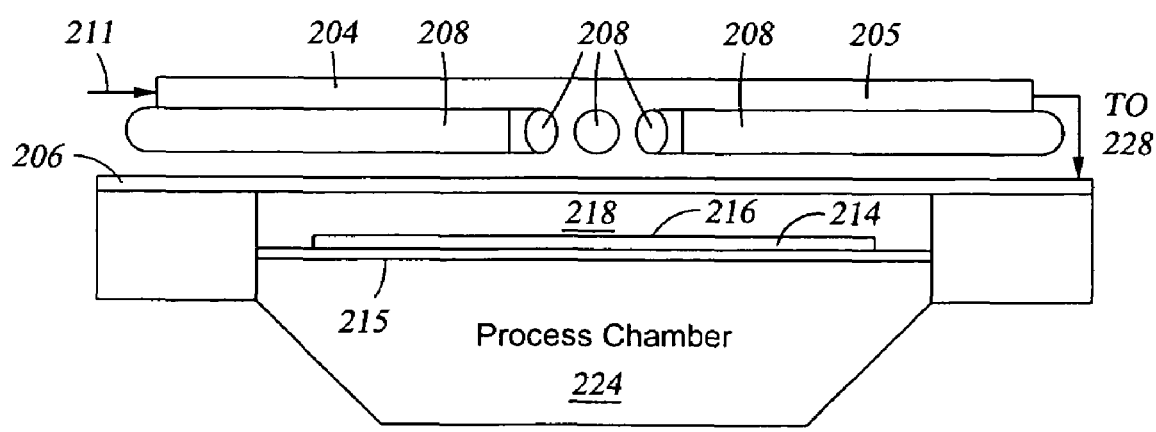
FIG. 2C is a side view of the U.V. radiation chamber 205 including the processing/reaction volume 218 between the bottom of quartz U.V. transmission window 206 and the support pedestal 215 on which substrate 214 is positioned. The distance d between the U.V. radiation source 208 and the upper surface 216 of substrate 214 is also illustrated.

FIG. 2C is a side view of the U.V. radiation chamber 230 including the volume 205 between U.V. transmission window 206 and quartz upper chamber window 204. FIG. 2C also shows the process chamber 224 which includes processing volume 218 which is present between U.V. transmission window 206 and substrate 214. The distance "d" represents the spacing between the substrate surface 216 and the U.V. radiation source. This distance "d" is set to obtain the desired U.V. radiation density at the substrate 214 surface 216.

The process chamber illustrated in FIGS. 2A through 2C may be modified so that the distribution of infrared heating lamps and excimer lamps with respect to the substrate varies from that shown. Further, a different process chamber design may have different requirements. What is important is that the infrared lamp distribution, or other device(s) used to apply heat to the process provide even heating of the substrate and enable accurate and precise control over the substrate temperature. In addition, the excimer lamps or other source of the about 310 nm to about 120 nm radiation must provide uniform radiation of the substrate and enable the introduction of sufficient energy into the gaseous phase and at the surface of the substrate to permit production of reactive species and adsorption of reactants with corresponding desorption of epitaxial film growth byproducts necessary to produce a high quality epitaxially-grown film at a commercially viable growth rate. As mentioned above, our current data indicates that the power density requirement at the substrate surface for epitaxial growth of a high quality silicon-containing film is in the range of 1 mW/cm$^2$ to 25 mW/cm$^2$. Typical silicon-containing component gases used as a source of epitaxial film growth species include: SiH$_2$Cl$_2$, or SiH$_4$, or Si$_2$H$_6$, or a combination thereof; used in combination with GeH$_4$ or Ge$_2$H$_6$ when a silicon/germanium film is produced; and these component gas sources of silicon and/or germanium typically used in combination with HCl or Cl$_2$ or HBr, or a combination thereof when a selective film deposition is required. The typical power density used for these precursor materials ranges from about 1 mW/cm$^2$ to about 25 mW/cm$^2$. Preferably the power density ranges from about 2 mW/cm$^2$ to about 10 mW/cm$^2$. With respect to FIG. 2A, the substrate 216 may be rotated relative to the U.V. radiation sources 208 by rotating shaft 240, to rotate pedestal 215 on which substrate 216 rests. This provides radially symmetric radiation with respect to the U.V. radiation source 208. Shaft 240 is typically rotated at a speed ranging from about 12 rpm to about 90 rpm.

In order to reduce the activation energy of a given thermal process, non-thermal energy can be supplied by ions, electrons or photons (with a wavelength of less than about 180 nm when epitaxially grown, silicon-containing films are to be produced). The important consideration is that, for most atoms, ionization occurs for photon energies greater than about 10 eV. This means that photons with energy less than about 10 eV can provide purely quantum effects (excited states of the atoms, molecules, radicals etc. participating in the chemical and/or physical process) and no adverse effects will be observed. However, for enhancing the surface cleaning/passivation reaction where native oxide is removed and dangling bonds are passivated with hydrogen prior to epi growth, it is advisable to use additional energy and a total energy of 10 eV or slightly higher may be advantageous.

The use of photons of low wavelength, 180 nm and lower provides a surprising increase in the ability of the substrate surface to absorb reactant species while desorbing reaction byproducts generated by formation of a silicon-containing epitaxially grown film. The principle underlying the operation of excimer lamps capable of producing such low wavelength radiation relies on the radiative decomposition of excimer (excited dimer) states created by a dielectric barrier discharge (silent discharge) in a rare gas such as $Ar_2^*$ ($\lambda$=126 nm, 9.84 eV), $Kr_2^*$ ($\lambda$=146 nm, 8.49 eV), or $Xe_2^*$ ($\lambda$=172 nm, 7.21 eV) or molecular rare gas halide complexes such as ArF* ($\lambda$=193 nm, 6.42 eV), KrCl* ($\lambda$=222 nm, 5.58 eV), KrF* ($\lambda$=248 nm 5.01 eV). The $Ar_2^*$, $Kr_2^*$, and $Xe_2^*$ excimer lamps provide intense radiation at 126 nm, 146 nm, and 172 nm, respectively and represent promising light sources for photo-assisted epitaxial growth silicon-containing film deposition. The high energy intensity will dissociate gas phase components into reactive species and enhance surface mobility, while increasing $H_2$, $SiCl_2$ and HCl desorption from the substrate surface.

The higher order silanes and chlorosilanes may be used as a source of silicon, including dichlorosilanes, hexachlorodisilane, dibromosilane, and their derivatives, by way of example and not by way of limitation, can be used as sources for silicon. $GeH_4$, $Ge_2H_6$, $GeCl_4$, and $GeH_2Cl_2$ may be used as germanium sources, by way of example and not by way of limitation. These precursor sources of silicon and germanium provide an acceptable growth rate when the substrate temperature ranges from about 350° C. to about 550° C., and a high growth rate when the substrate temperature is about 550° C. to about 650° C.

By using 172 nm U.V. radiation to assist in the film growth process, a growth rate enhancement of 35% and greater has been achieved for the blanket film growth of a 26% Ge-containing SiGe film at a substrate temperature of 550° C. This will be discussed with reference to FIG. 4 subsequently herein.

II. EXAMPLES

Example One

Prior to epitaxial growth of a silicon-containing film on a substrate, it is necessary to remove native oxides on the substrate surface which affect the surface lattice structure, and to terminate dangling bonds with hydrogen, to provide a clean passivated surface for subsequent growth of a silicon-containing epi film. Often, the substrate is a silicon wafer having a native oxide on the wafer surface. The bulk of the native oxide is removed using a wet chemical process, typically an aqueous HF dip. Subsequent to this bulk removal of native oxides, we used an in-situ cleaning/passivation process carried out in the coating deposition chamber to remove residual oxide and hydrocarbon and to passivate the substrate surface prior to epitaxial growth of the silicon-containing film. During the in-situ cleaning/passivation method the substrate is exposed to a hydrogen ambient in the processing volume with simultaneous exposure to radiation at a wavelength of about 180 nm or lower. In the processing apparatus previously described herein, the hydrogen flow rate was in the range of 25 slm to 50 slm. The temperature at the substrate surface was in the range of 500° C. to 650° C. for a time period ranging from about one minute to about 5 minutes. The pressure in the processing volume may range from about 0.1 Torr to about 100 Torr, typically the pressure is in the range of about 5 Torr to about 30 Torr. The power density may range from about 2 $mW/cm^2$ to about 25 $mW/cm^2$, and is typically in the range of about 2 $mW/cm^2$ to about 10 $mW/cm^2$. The spacing "d" between the substrate surface and the radiation source typically ranges between about 5 cm and about 20 cm, preferably between about 5 cm and about 10 cm. The treatment time for the substrate typically ranges from about 1 minute to about 5 minutes.

Example Two

Figure 3:
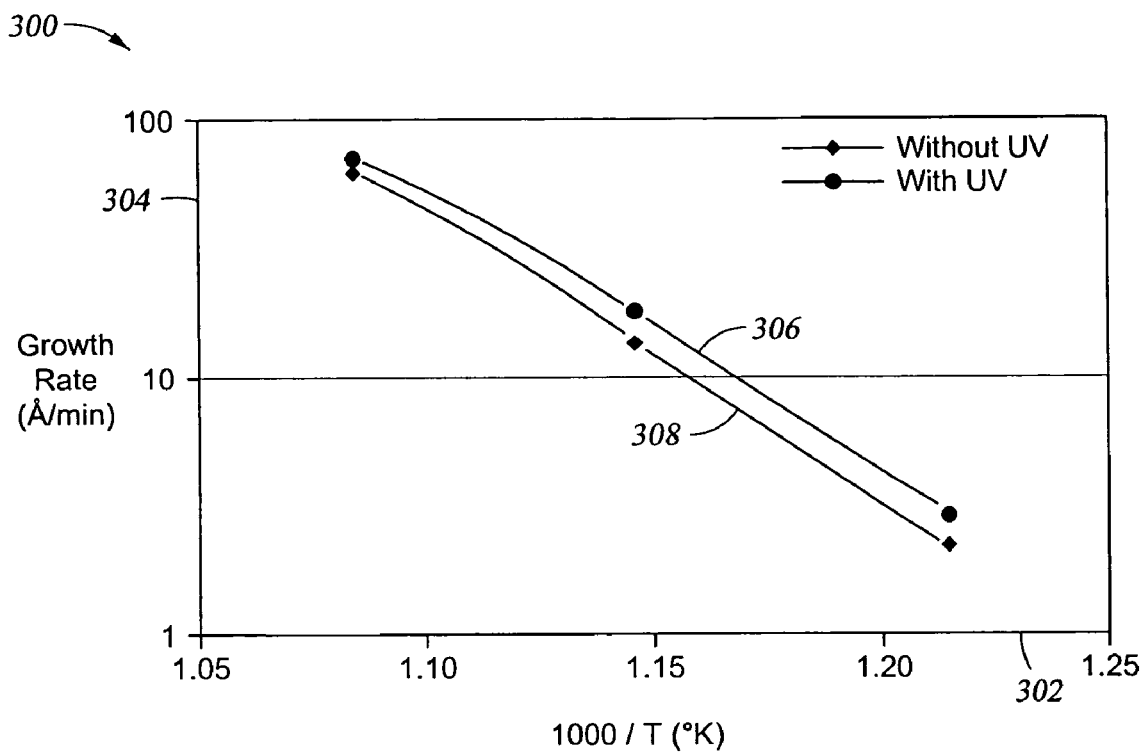
FIG. 3 shows a graph of the epitaxial growth rate of a blanket deposited silicon-germanium film with and without the benefit of 172 nm radiation within the film deposition process chamber, for films deposited at temperatures ranging from 550° C. to 750° C. The silane-containing precursor was dichlorosilane, the source of germanium was germane, and the 172 nm radiation was present at a power density of about 2 mW/cm$^2$.

FIG. 3 shows a graph 300 of the epitaxial growth rate of a silicon/germanium film with and without the benefit of 172 nm radiation within the film deposition process volume, for films deposited at temperatures ranging from 550° C. to 750° C. The substrate temperature in degrees C. is shown on scale 302, while the growth rate in Å/min is shown on scale 304. Curve 308 is representative of the film growth rate without the benefit of the 172 nm radiation. Curve 306 is representative of the film growth rate with the benefit of the 172 nm radiation. When the 172 nm radiation was present, the power density at the substrate surface was about 2 $mW/cm^2$. The silicon-containing component of the deposition process gas was $SiH_2Cl_2$ and the germanium-containing component was $GeH_4$, the ratio of silicon:germanium was in the range of about 1:20. The spacing "d" between the upper surface 216 of substrate 214 and the radiation sources 208 (as shown in FIG. 2A) was about 5 cm. The process volume 218 was about 7500 cc. The total flow rate of process gases into process volume 218 was about 30 slm. The flow rate of the flow rate of $SiH_2Cl_2$ was 100 sccm, and the flow rate of 1% by volume $GeH_4$ in hydrogen was variable from 300 sccm to 500 sccm (providing 3 sccm to 5 sccm of $GeH_4$). The pressure in the process volume 218 was 10. The power density applied was 2 $mW/cm^2$.

Example Three

Figure 4:
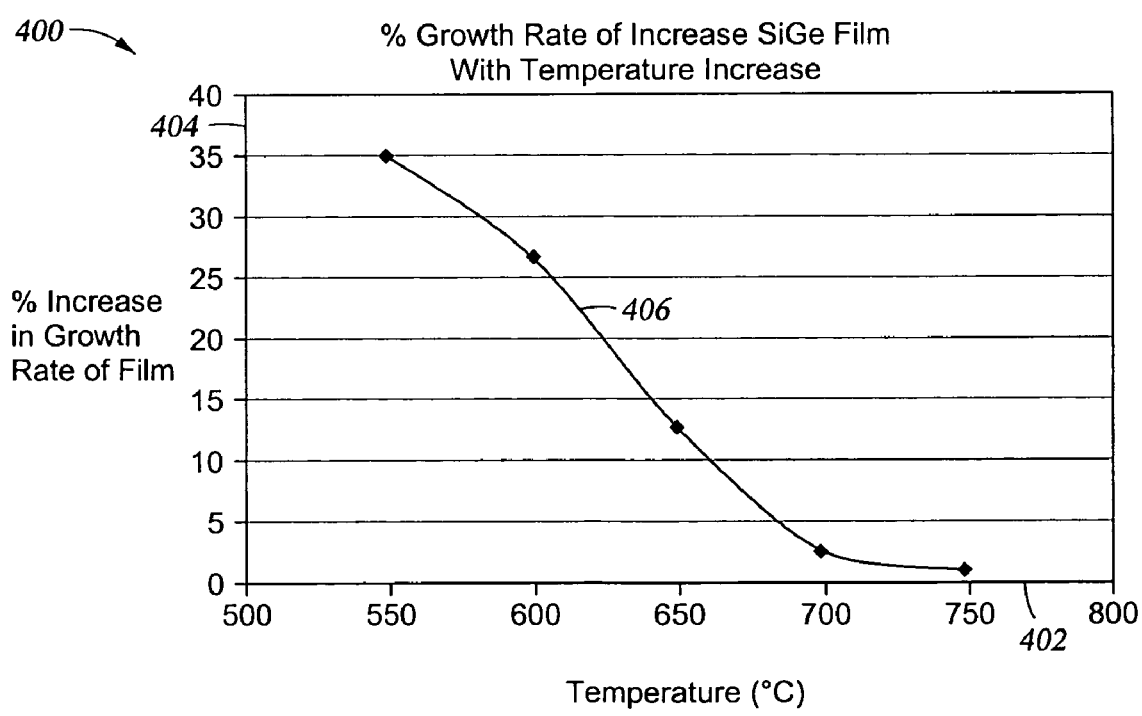
FIG. 4 shows a graph of the enhancement of the growth rate of the blanket deposited silicon-germanium film illustrated in FIG. 3, where UV radiation is employed (Curve 306), as a function of the substrate temperature at which the film growth is carried out.

FIG. 4 shows a graph 400 of the enhancement of growth rate of a silicon/germanium film due to the employment of the 172 nm radiation in the process volume during film formation. The growth rate is shown as a function of the substrate temperature at which the film growth is carried out. The process conditions were those described above with reference to FIG. 3. The substrate temperature is shown in degrees C. on scale 402, the increase in growth rate of the silicon/germanium film is shown on scale 404, and Curve 406 shows the relationship, which illustrates that the presence of the 172 nm radiation in the process volume has an increasing beneficial effect at lower temperatures.

Example Four

Figure 5:
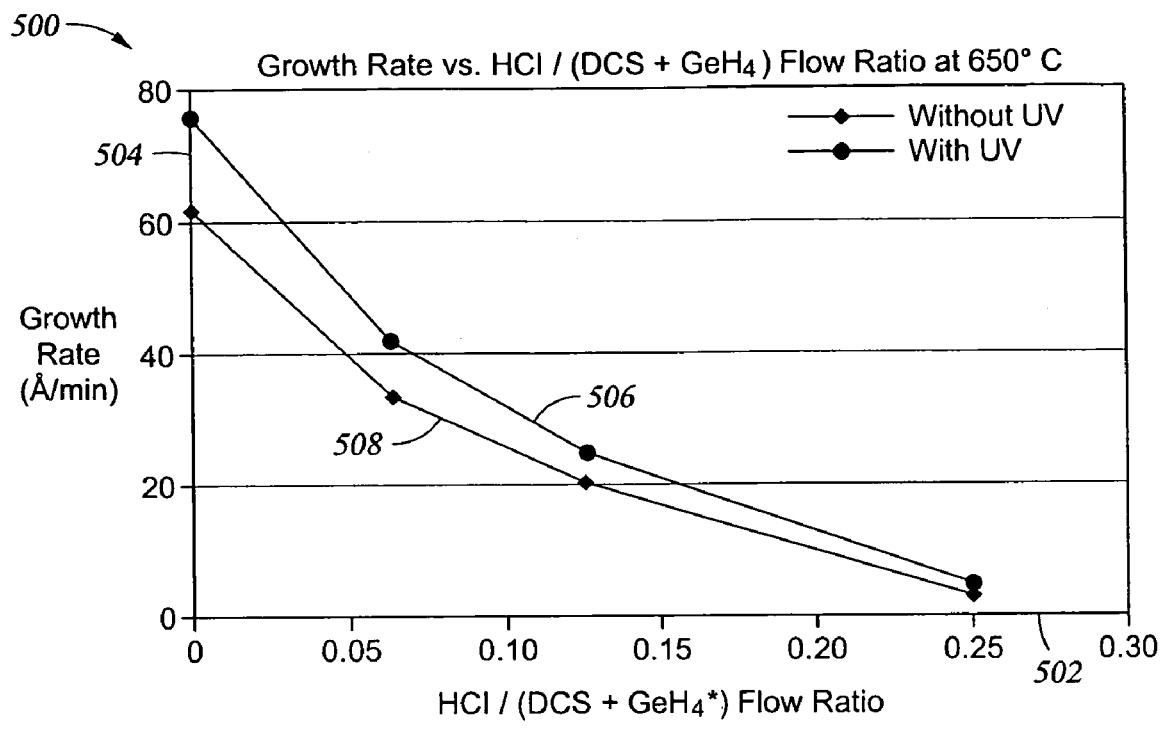
FIG. 5 shows a graph of the film growth rate for a selectively deposited silicon-germanium film, with and without the employment of UV radiation, as a function of the flow ratio of HCl:GeH$_4$ (at 1% by volume in hydrogen) during the film deposition process. When the flow ratio of HCl:DCS+GeH$_4$ (at 1% in hydrogen) is below about 0.1, the deposition becomes non-selective, blanket Si$_x$Ge$_{1-x}$ film growth. The ratio of germanium to silicon in the precursor feed gases was about 1:20, at a total precursor gas flow (including hydrogen) ranging from about 15-35 slm, the UV radiation was 172 nm wavelength, at a power density of about 2 mW/cm$^2$.

FIG. 5 shows a graph 500 of the film growth rate for a selective deposition of a silicon-germanium film, with and without the employment of U.V. 172 nm radiation in the process volume, as a function of the flow ratio of $HCl:GeH_4$ (at 1% by volume in hydrogen). When this flow ratio is below about 0.1, the deposition becomes non-selective, blanket $Si_xGe_{1-x}$ film growth. The substrate temperature was 650° C.; the pressure in the process volume was 10; the power density was 2 mW/cm². The flow rate of the $SiH_2Cl_2$ was 100 sccm, and the flow rate of $GeH_4$ in hydrogen ranged from about 300 sccm to about 500 sccm, providing a volumetric ratio of Si:Ge in the process gas feed of about 100:3 to about 100:5. The volumetric flow ratio of HCl:(DCS+$GeH_4$ (at 1% in hydrogen) is shown on scale 502, while the film growth rate in Å/min is shown on scale 504. Curve 508 represents the relationship in the absence of any 172 mm radiation input. Curve 506 represents the relationship where 172 nm radiation is applied at a power density of 2 mW/cm². The deposition is more selective as the ratio of HCl:(DCS+$GeH_4$) increases. The volumetric ratio of HCl or $Cl_2$ or HBr to the silicon-containing precursor may range from about 0.05:1 to about 50:1, and is at least 0.05:1.

Figure 6:
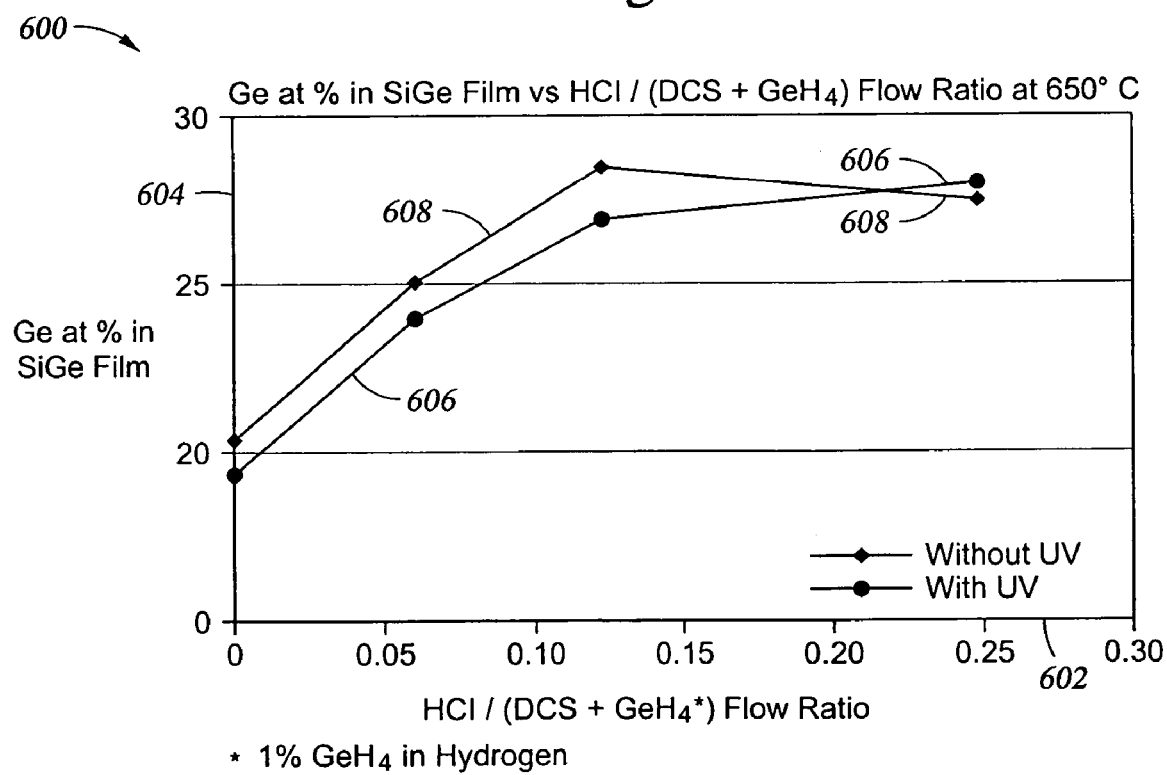
FIG. 6 shows a graph of the percentage of germanium in the selectively deposited silicon-germanium film for which data is provided in FIG. 5. The percentage of germanium in the Si$_x$Ge$_{1-x}$ film is shown for film growth with and without the employment of UV radiation. The percentage of germanium in the film is shown as a function of the flow ratio of HCl:GeH$_4$ (at 1% by volume in hydrogen) during the film deposition process. When the flow ratio of HCl:DCS+GeH$_4$ (at 1% in hydrogen) is below about 0.1, the deposition becomes non-selective, blanket Si$_x$Ge$_{1-x}$ film growth. The ratio of germanium to silicon in the precursor feed gases was about 1:20, at a total precursor gas flow (including hydrogen) ranging from about 15-35 slm, the UV radiation was 172 nm wavelength, at a power density of about 2 mW/cm$^2$.

FIG. 6 shows a graph 600 of the percentage of germanium in the selectively deposited silicon-germanium films produced under the process conditions discussed with reference to FIG. 5, as a function of the flow ratio of HCl:$GeH_4$ (at 1% by volume in hydrogen), for films produced with and without 172 nm radiation in the process volume. When this flow ratio is below about 0.1, the deposition becomes non-selective, blanket $Si_xGe_{1-x}$ film growth. The volumetric flow ratio is shown on scale 602, while the percent germanium in the silicon/germanium film is shown on scale 604. Curve 608 is representative of the silicon/germanium films formed without radiation input into the process volume. Curve 606 is representative of the silicon/germanium films formed when the 172 nm radiation was present at a power density of 2 mW/cm². The germanium content of films deposited by the method of the invention may range from about 1% to about 90%, and typically ranges from about 5% to about 40%.

Example Five

Figure 7:
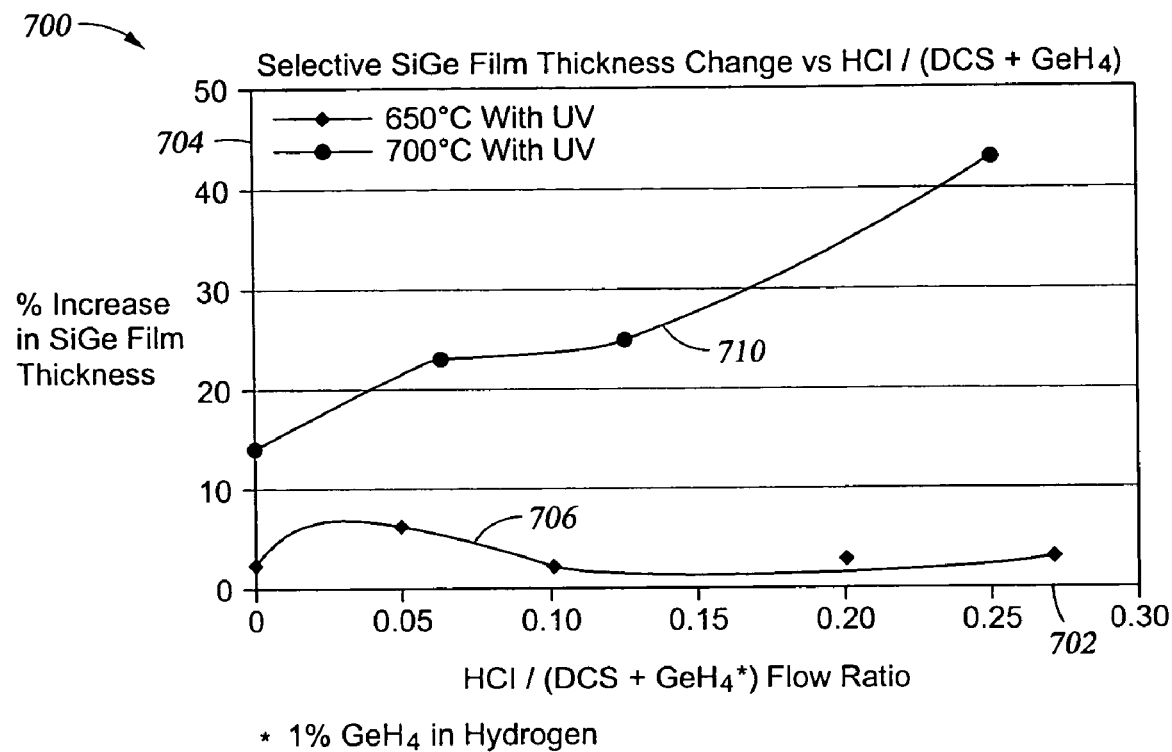
FIG. 7 shows a graph of the percentage change in the Si$_x$Ge$_{1-x}$ film thickness as a function of the flow ratio of HCl:GeH$_4$ (at 1% by volume in hydrogen), and as a function of temperature in ° C. (at 650° C. and 700° C.°) when U.V. radiation is applied during the film deposition process. When the flow ratio of HCl:DCS+GeH$_4$ (at 1% in hydrogen) is below about 0.1, the deposition becomes non-selective, blanket Si$_x$Ge$_{1-x}$ film growth. The ratio of germanium to silicon in the precursor feed gases was about 1:20, at a total precursor gas flow (including hydrogen) ranging from about 15-35 slm, the UV radiation was 172 nm wavelength, at a power density of about 2 mW/cm$^2$.

FIG. 7 shows a graph 700 of the percentage change in the film thickness of a selectively deposited silicon-germanium film as a function of the temperature at which the film deposition was carried out, and as a function of as a function of the flow ratio of HCl:$GeH_4$ (at 1% by volume in hydrogen). When this flow ratio is below about 0.1, the deposition becomes non-selective, blanket $Si_xGe_{1-x}$ film growth. The pressure in the process volume was 10; the power density was 2 mW/cm². The flow rate of the $SiH_2Cl_2$ was 100 sccm, and the flow rate of 1% by volume $GeH_4$ in hydrogen ranged from about 300 sccm to about 500 sccm, providing a volumetric ratio of Si:Ge in the process gas feed of about 100:3 to about 100:5. The volumetric flow ratio of HCl:(DCS+$GeH_4$ (at 1% in hydrogen) is shown on scale 702, while the percentage increase in film thickness (an indication of film growth rate) is shown on scale 704. Curve 706 shows the relationships for a 700° C. substrate temperature during film deposition, while Curve 710 shows the relationship for a 650° C. substrate temperature during film deposition. It is readily apparent that at lower temperatures, the use of the U.V. radiation during film deposition has a much greater influence on the rate of film growth.

Figure 8:
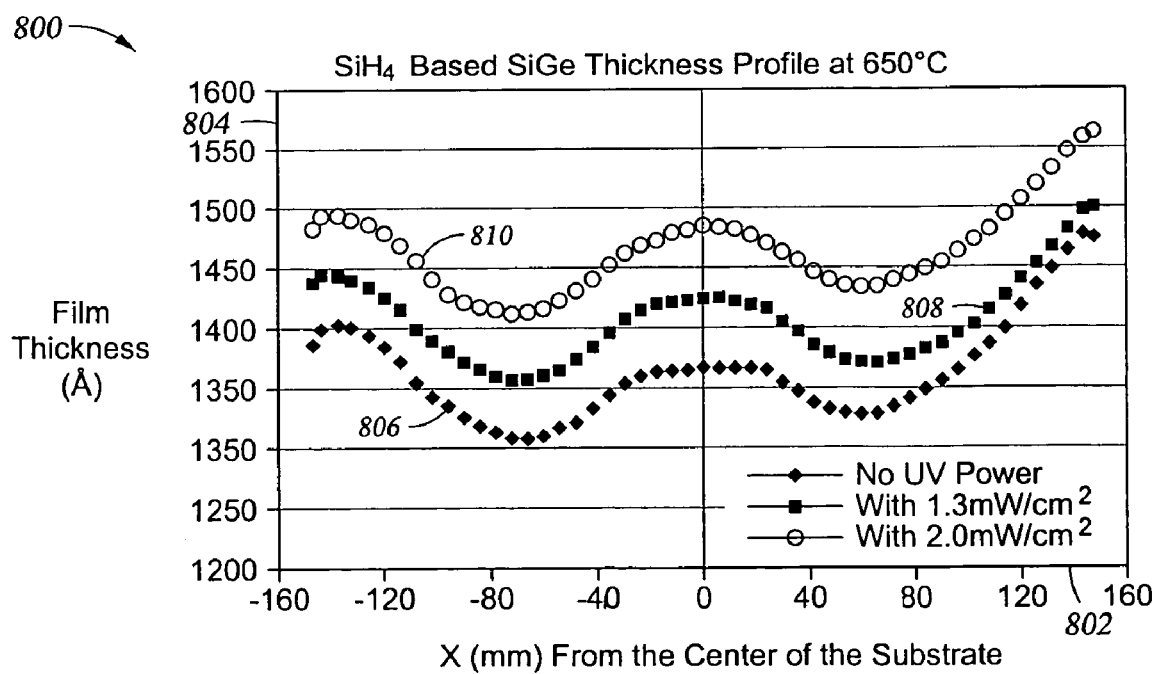
FIG. 8 shows a graph of the film thickness of a blanket deposited silicon-germanium film as a function of the power applied in the form of 172 nm radiation, where the effect of the presence of the 172 nm radiation is illustrated across the entire substrate surface, as mm from center of the substrate (wafer). The ratio of Ge:Si in the precursor gases for deposition was about 1:20. The UV radiation was 172 nm wavelength.

FIG. 8 shows a graph 800 of the film thickness of a blanket deposited silicon-germanium film as a function of the power density of the U.V. radiation applied during film deposition. In the instances when U.V. radiation was applied, it was 172 nm radiation. The effect of the presence of the 172 nm radiation is illustrated across the entire substrate surface, as mm from center of the substrate (wafer). The distance from the center of the substrate in mm is specified in scale 802, while the silicon/germanium film thickness in Angstroms is specified in scale 804. Curve 806 represents the relationship when no 172 nm radiation was present in the processing volume. Curve 808 represents the relationship when the 172 nm radiation was present at a power density of about 1.3 mW/cm² at the substrate surface. Curve 810 represents the relationship when the 172 nm radiation was present at a power density of about 2.0 mW/cm². The other process conditions were essentially the same as those discussed with respect to FIG. 3, with the substrate temperature during film deposition being 650° C.

The power density can be increased substantially above the 2.0 mW/cm² density, and a substantial corresponding increase in film growth rate is expected to occur. The convenient upper limit on power density application is in the range of about 25 mW/cm² when the apparatus is as described previously herein.

Example Six

Figure 9:
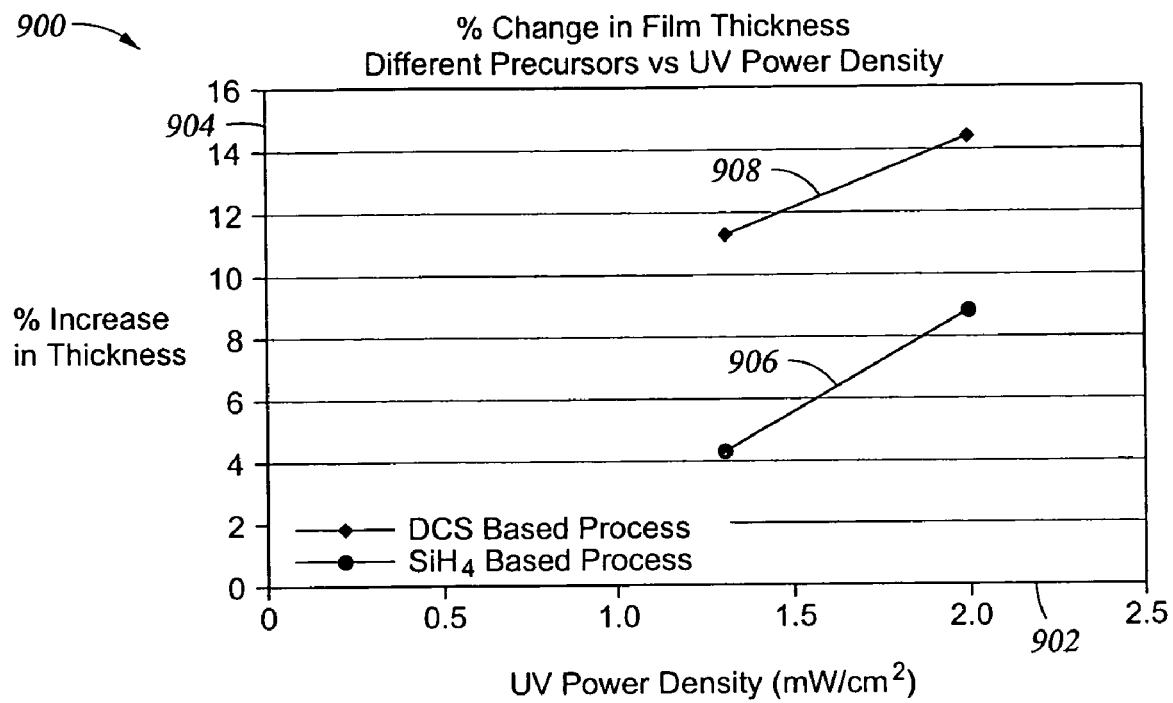
FIG. 9 shows a graph of percentage increase in the film thickness (growth rate) of a blanket deposited silicon-germanium film as a function of the silicon-containing precursor gas used and as a function of the power density in mW/cm$^2$.

FIG. 9 shows a graph of percentage increase in a blanket deposited silicon-germanium film thickness as a function of the precursor used for the silicon source and as a function of the power applied in the form of 172 nm radiation. The amount of power applied is shown in mW/cm² on scale 902, while the percentage of increase in film thickness is shown on scale 904. Curve 906 shows the percentage increase in film thickness, as compared with film deposition which is not U.V. enhanced, for a $SiH_4$-based process, where Curve 908 shows the percentage increase in film thickness for a $SiH_2Cl_2$—based process when UV radiation is used to enable an increased film growth rate. It is readily apparent that the film growth rate is faster when the chlorine containing silicon precursor component is used. The substrate temperature was 650° C.; the pressure in the process volume was 10; The flow rate of the $SiH_2Cl_2$ was 100 sccm, with a $GeH_4$ (1% in hydrogen) flow rate of 300 sccm. The flow rate of the $SiH_4$ was 100 sccm, with a $GeH_4$ (1% in hydrogen) flow rate of 300 sccm. These flow rates provided an germanium atomic concentration in the Si:Ge film of about 17.5% when the silicon-containing precursor was DCS, and about 10% when the silicon-containing precursor was $SiH_4$.

The above described exemplary embodiments are not intended to limit the scope of the present invention, as one skilled in the art can, in view of the present disclosure expand such embodiments to correspond with the subject matter of the invention claimed below.

We claim:

1. A method of epitaxially growing a silicon-germanium-containing film on a surface, which surface enables epitaxial growth of a silicon-germanium-containing film having a desired structure, said film growing method comprising the use of lamp-generated radiation having a wavelength ranging from about 310 nm to about 120 nm applied with radial symmetry directly to said surface in a processing chamber in which said film growing method is carried out, where the power density of said radiation ranges from about 1 mW/cm² to about 25 mW/cm² on said surface, and where said film-growing method is carried out at a temperature ranging between about 500° C. and about 750° C., at a pressure ranging between about 1 Torr and about 80 Torr.

2. A method in accordance with claim 1, wherein the growth rate of said silicon-germanium-containing film is in excess of about 60 Å/minute.

3. A method in accordance with claim 1, wherein said silicon-germanium-containing epitaxially grown film comprises an atomic percent of germanium which is constant within a range from 1% to about 99%.

4. A method in accordance with claim 3, wherein said epitaxially grown silicon-germanium-containing film comprises an atomic percent of germanium which is constant within a range from 5% to about 40%.

5. A method in accordance with claim 4, wherein said silicon-germanium film is blanket deposited and wherein a precursor providing silicon to said epitaxially grown film is selected from the group consisting of silanes, chlorosilanes, and combinations thereof.

6. A method in accordance with claim 5, wherein said precursor is selected from the group consisting of dichlorosilane, dibromosilane, hexachlorodisilane, and combinations thereof.

7. A method in accordance with claim 5, wherein a precursor providing germanium to said epitaxially grown film is selected from the group consisting of $GeH_4$, $Ge_2H_6$, $GeCl_4$, $GeH_2Cl_2$, and combinations thereof.

8. A method in accordance with claim 6, wherein a precursor providing germanium to said epitaxially grown film is selected from the group consisting of $GeH_4$, $Ge_2H_6$, $GeCl_4$, $GeH_2Cl_2$, and combinations thereof.

9. A method in accordance with claim 3, wherein said silicon-germanium film is selectively deposited and wherein a precursor providing silicon to said selectively deposited epitaxially grown film is selected from the group consisting of silanes, chlorosilanes, bromosilanes, and combinations thereof.

10. A method in accordance with claim 9, wherein said precursor is selected from the group consisting of dichlorosilane, dibromosilane, hexachlorodisilane, and derivatives thereof.

11. A method in accordance with claim 9, wherein a precursor providing germanium to said epitaxially grown film is selected from the group consisting of $GeH_4$, $Ge_2H_6$, $GeCl_4$, $GeH_2Cl_2$, and combinations thereof.

12. A method in accordance with claim 9, wherein HCl or HBr or $Cl_2$, or a combination thereof, is present during said selective deposition of said silicon-germanium film at a volumetric ratio to said silicon-containing precursor of at least 0.05:1.

13. A method in accordance with claim 12, wherein HCl or HBr or $Cl_2$, or a combination thereof, is present during said selective deposition of said silicon-germanium film at a volumetric ratio to said silicon-containing precursor within the range of about 0.05:1 to about 50:1.

14. A method in accordance with claim 12, wherein said precursor is selected from the group consisting of dichlorosilane, hexachlorodisilane, and derivatives thereof.

15. A method in accordance with claim 13, wherein a precursor providing germanium to said epitaxially grown film is selected from the group consisting of $GeH_4$, $Ge_2H_6$, $GeCl_4$, $GeH_2Cl_2$, and combinations thereof.

16. A method in accordance with claim 14, wherein a precursor providing germanium to said epitaxially grown film is selected from the group consisting of $GeH_4$, $Ge_2H_6$, $GeCl_4$, $GeH_2Cl_2$, and combinations thereof.

17. A method of epitaxially growing a silicon-germanium film on a surface, where the surface enables epitaxial growth of a silicon-germanium film having a desired structure, said film growing method comprising the use of radiation having a wavelength ranging from about 310 nm to about 120 nm in the processing volume in which said film growing method is carried out, where the power density of said radiation ranges from about 1 $mW/cm^2$ to about 25 $mW/cm^2$, and wherein said film-growing method is carried out at a temperature ranging between about 500° C. and about 750° C., at a pressure ranging between about 1 Torr and about 80 Torr.

18. A method in accordance with claim 17, wherein an atomic percent of germanium in said epitaxially grown film is constant within a range from 5% to about 40%.

19. A method in accordance with claim 18, wherein a precursor providing germanium to said epitaxially grown film is selected from the group consisting of $GeH_4$, $Ge_2H_6$, $GeCl_4$, $GeH_2Cl_2$, and combinations thereof.

20. A method in accordance with claim 1, wherein, prior to the growing of said silicon-germanium containing film, said surface upon which said silicon-germanium-containing film is grown is cleaned and passivated to provide a surface which permits epitaxial growth of silicon-germanium-containing films, said cleaning and passivating comprising the use of hydrogen species in contact with said substrate surface, in combination with the use of radiation having a wavelength ranging from about 310 nm to about 120 nm in the processing volume in which said cleaning and passivation is carried out, where the power density of said radiation is at least 1 $mW/cm_2$, and wherein said cleaning and passivation is carried out at a temperature below 750° C.

21. A method in accordance with claim 20, wherein said radiation has a wavelength ranging from about 180 nm to about 120 nm in the processing volume in which said cleaning and passivation is carried out.

22. A method in accordance with claim 21, wherein said power density ranges from about 1 $mW/cm^2$ and about 25 $mW/cm^2$, and wherein said cleaning and passivation is carried out at a temperature ranging from about 700° C. to about 500° C.

23. A method in accordance with claim 22, wherein the total pressure in the substrate processing volume ranges from about 0.1 Torr to about 80 Torr.

24. A method in accordance with claim 17, wherein, prior to the growing of said silicon-germanium film on said surface, said surface is cleaned and passivated to provide a surface which permits epitaxial growth of silicon-germanium containing films, said cleaning and passivating comprising the use of hydrogen species in contact with said surface, in combination with the use of radiation having a wavelength ranging from about 310 nm to about 120 nm in the processing volume in which said cleaning and passivation is carried out, where the power density of said radiation is at least 1 $mW/cm^2$, and wherein said cleaning and passivation is carried out at a temperature below 750° C.

25. A method in accordance with claim 24, wherein said radiation has a wavelength ranging from about 180 nm to about 120 nm in the processing volume in which said cleaning and passivation is carried out.

26. A method in accordance with claim 25, wherein said power density ranges from about 1 $mW/cm^2$ and about 25 $mW/cm^2$, and wherein said cleaning and passivation is carried out at a temperature ranging from about 700° C. to about 500° C.

27. A method in accordance with claim 26, wherein the total pressure in the substrate processing volume ranges from about 0.1 Torr to about 80 Torr.

\* \* \* \* \*